United States Patent [19]

Cornelissen

[11] Patent Number: 4,800,534
[45] Date of Patent: Jan. 24, 1989

[54] INTEGRATED MEMORY CIRCUIT

[75] Inventor: Bernardus H. J. Cornelissen, Eindhoven, Netherlands

[73] Assignee: U.S. Philips Corp., New York, N.Y.

[21] Appl. No.: 916,778

[22] Filed: Oct. 9, 1986

[30] Foreign Application Priority Data

Oct. 15, 1985 [NL] Netherlands ............... 8502811

[51] Int. Cl.⁴ .............................. G11C 13/00
[52] U.S. Cl. ..................... 365/233; 365/73; 365/189
[58] Field of Search ............ 365/63, 73, 75, 184, 365/189, 190, 191, 193, 233

[56] References Cited

U.S. PATENT DOCUMENTS 4,649,511  3/1987  Gdula ..................... 365/233

Primary Examiner—Terrell W. Fears
Attorney, Agent, or Firm—Bernard Franzblau

[57] ABSTRACT

An integrated memory circuit includes a memory loop which comprises two gates which are controlled by a clock signal. The circuit is susceptible to a race condition so that correct operation cannot always be ensured. The "race" problem is solved by choosing the switching thresholds of the gate inputs receiving the clock signal so that the gates respond successively instead of (sustantially) simultaneously to the clock signal. The correct switching sequence of the gates and the correct operation of the memory circuit can thus be ensured.

10 Claims, 1 Drawing Sheet

INTEGRATED MEMORY CIRCUIT

BACKGROUND OF THE INVENTION

This invention relates to an integrated memory circuit including a clock input for receiving a clock signal, a data input for receiving a data bit under the control of the clock signal, and a data output, the memory circuit also including a memory loop comprising a first and a second gate.

A memory circuit of this kind is known from the Philips Data Handbook "Integrated Circuits", book IC06N, new series 1985, showing a logic diagram of a flip-flop circuit in the integrated circuit HCT74 on page 188. This flipflop circuit includes two memory circuits, each of which includes a memory loop with two NAND-gates and a transfer gate. In addition, each memory loop is provided with a second transfer gate which is connected to its input. The use of transfer gates has the drawback that they must be driven by the clock signal and by the inverted clock signal. Consequently, at high clock frequencies unavoidable phase differences will occur between these clock signals so that the reliability of the memory loops can no longer be ensured.

However, it is alternatively possible to omit the transfer gates from the memory loops and to replace the transfer gates at the inputs of the memory loops by logic input gates which conduct a data bit to the memory loops under the control of the clock signal. Memory circuits of this kind have the drawback that correct storage of a data bit may be dependent on the signal propagation through the individual gates. The operation cannot be predicted or ensured in all circumstances, which makes such a memory circuit unsuitable for practical use in, for example, integrated circuits.

SUMMARY OF THE INVENTION

It is an object of the invention to provide an integrated memory circuit in which no inverted clock signal need be formed and in which the operation can be predicted and ensured.

To this end, an integrated memory circuit in accordance with the invention is characterized in that both gates can be switched by the clock signal, the switching threshold of the first gate deviating substantially from the switching threshold of the second gate. As a result of the use of different switching thresholds, one of the two gates will always react sooner to a clock signal transition, so that the switching sequence of the gates is defined and the operation of the memory circuit can be predicted and ensured.

BRIEF DESCRIPTION OF THE DRAWING

The invention will be described in detail hereinafter with reference to embodiments shown in the accompanying drawing; in which.

DESCRIPTION OF THE PREFERRED EMBODIMENTS

Figure 1:
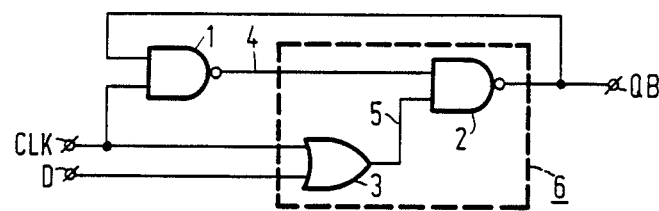
FIG. 1 shows a logic diagram of an embodiment of the memory circuit in accordance with the invention.

FIG. 1 shows a logic diagram of a memory circuit in accordance with the invention in which the memory loop includes a first NAND-gate (1) and a second NAND-gate (2), the output (4) of the NAND-gate (1) being connected to a first input of the second NAND-gate (2) and vice versa.

A second input of the first gate (1) is connected to the clock input (CLK) and the second input (5) of the second gate (2) is connected to the output of an OR-gate (3), a first input of which is connected to the clock input (CLK) and a second input of which is connected to a data input (D). This memory circuit has two states: the write state in the case of a "low" clock signal, and the hold state in the case of a "high" clock signal on the clock input (CLK). In the hold state, the memory circuit saves the data in the memory loop; in the write state a data bit on the data input (D) is written into the memory loop.

This circuit is susceptible to a so-called "race-condition" which occurs when the circuit changes over from the write state to the hold state under the control of the clock signal and the data bit on the data input (D) is 0 (or "low"). Briefly before this transition, the clock signal on the clock input is "low", so that point 4 is "high" (or 1). Because the data bit is 0, the second input (5) of the second gate (2) will be "low", so that the output (QB) of the circuit is "high". When the clock signal changes over from "low" to "high", the output signals of the first NAND-gate (1) and the OR-gate (3) will change. This means that the first (4) and the second (5) input of the second NAND-gate (2) substantially simultaneously receive a changing input signal. If the output (5) of the OR-gate (3) reacts faster than the output (4) of the first NAND-gate (1), the second input of the second NAND-gate will become "1" while its first input is "high" and its output (QB) will change from "high" to "low". The first NAND-gate (1) receive this "low" signal on its first input, so that its output (4) can no longer switch from "1" to "0". Due to the fast reaction of the gate combination (6) formed by the second NAND-gate (2) and the OR-gate (3), incorrect data will be stored in the hold state.

This adverse effect is avoided by ensuring that the output (QB) of the gate combination (6) reacts comparatively slowly to the transition of the clock signal from "low" to "high". The first gate (1) must then react comparatively quickly to the clock signal transition. This effect is realized by making the switching threshold of the first gate (1) lower than the switching threshold of the gate combination (6).

Figure 2:
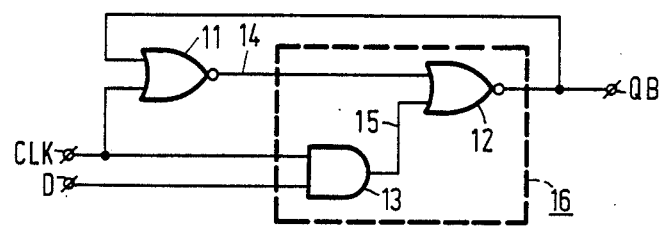
FIG. 2 shows a logic diagram of a second embodiment of a memory circuit in accordance with the invention.

FIG. 2 shows a logic diagram of a second embodiment of a memory circuit in accordance with the invention. The memory loop includes a first NOR-gate (11) and a second NOR-gate (12), the output (14) of the first NOR-gate (11) being connected to a first input of the second NOR-gate (12) and vice versa.

A second input of the first gate (11) is connected to the clock input (CLK) and the second input (15) of the second gate (12) is connected to an output of an AND-gate (13), a first input of which is connected to the clock input (CLK) and second input of which is connected to the data input (D). In the hold state, the clock signal is "low"; it is "high" in the write state. A race condition occurs when the clock signal changes over from "high" to "low" while the data bit on the data input (D) is 1 ("high"). Analogous to the description that the gate combination (16) must react more slowly to a clock signal transition than the first gate (11). Because the clock signal now changes from "high" to "low", the switching threshold of the first gate (11) must be higher than that of the gate combination (16).

Figure 3:
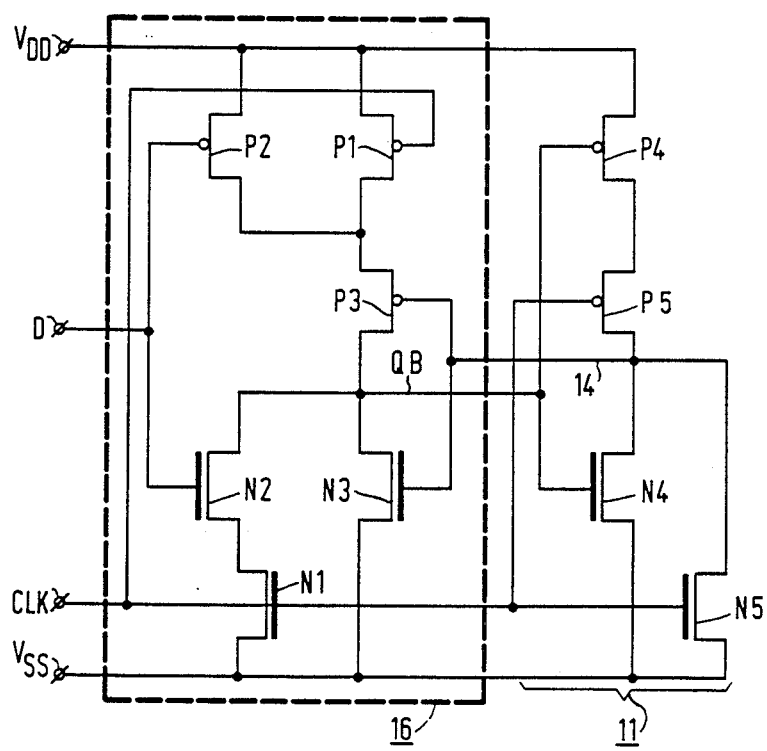
FIG. 3 shows a transistor diagram of the embodiment shown in FIG. 2.

FIG. 3 shows a transistor diagram of the logic diagram of the memory circuit shown in FIG. 2. The Figure is a known translation of the first NOR-gate into a transistor diagram (11) which can be realized as a complementary MOS circuit (CMOS). The gate combination of an AND-gate and a NOR-gate is also translated into a transistor diagram (16) in known manner.

Between the first supply terminal ($V_{DD}$) and the output (QB) the gate combination includes a branch with P-MOS transistors, parallel connected channels of a first P-MOS transistor (P1) and a second P-MOS transistor (P2) being connected on one side to the first supply terminal ($V_{DD}$) and on the other side, via the channel of a third P-MOS transistor (P3), to the output (QB).

Between the output (QB) and a second supply terminal ($V_{SS}$) the gate combination includes a branch with N-MOS transistors, a series connection of a first N-MOS transistor (N1) and a second N-MOS transistor (N2) being connected on one side to the output (QB) and on the other side to the second supply terminal ($V_{SS}$). The output (QB) is also connected, via the channel of a third N-MOS transistor (N3), to the second supply terminal ($V_{SS}$). The gate electrodes of the first P-MOS and N-MOS transistors (P1, N1) are connected to the clock input (CLK), the gate electrodes of the second P-MOS and N-MOS transistors (P2, N2) being connected to the data input (D) while the gate electrodes of the third P-MOS and N-MOS-transistors (P3, N3) are connected to the output (14) of the first NOR-gate (11). Between the first supply terminal ($V_{DD}$) and its output (14), the NOR-gate (11) includes series-connected channels of a fourth P-MOS-transistor (P4) and a fifth P-MOS-transistor (P5), the output (14) being connected, via parallel-connected channels of a fourth N-MOS-transistor (N4) and a fifth N-MOS-transistor (N5), to the second supply terminal ($V_{SS}$). The gate electrode of the fourth P-MOS transistor and the fourth N-MOS transistor (P4, N4) are connected to the output (QB) of the gate combination (16); the gate electrodes of the fifth P-MOS transistor and the fifth N-MOS transistor (P5, N5) are connected to the clock input (CLK).

The condition previous formulated for this memory circuit implies that the output (14) of the NOR-gate (11) must react faster to a clock signal transistion from "high" to "low" than the output (QB) of the gate combination (16). Therefore, the switching threshold of the NOR-gate (11) must be higher than that of the gate combination (16). The switching threshold of the NOR-gate (11) is raised by choosing a comparatively high ratio of the conductivity factors of the fourth P-MOS transistor (P4) and the fourth N-MOS transistor (N4). For a supply voltage of 5 volts, a ratio of four introduces a switching threshold shift of approximately 0.5 volts, so that the switching threshold corresponds to an input voltage of 2.5 V+0.5 V=3 volts.

When the conductivity factors of the first P-MOS and N-MOS transistors (P1, N1) are equal, the switching threshold of the gate combination (16) will be equal to half the supply voltage (2.5 volts), so that it will switch over only after the NOR-gate (12). In order to ensure reliable operation of the memory circuit, the difference between the switching thresholds should amount to at least 10% of the supply voltage (in this case 0.5 V). This is because the output of the CMOS gate which switches first will then be fully driven to one of the two supply voltage levels, so that the CMOS gate which subsequently switches over will receive a stable input signal.

In practical designs a difference of approximately 20% of the supply voltage preferably exists between the two switching thresholds. This choice offers an adequate margin for neutralizing unavoidable process spreads and temperature fluctuations.

A memory circuit as shown in FIG. 1 can also be translated into a transistor diagram in known manner. Mutatis mutandis, all of the above remarks are applicable again to such a transistor diagram. The memory circuits of the FIGS. 1 and 2 can be simply combined so as to form a so-called master-slave flipflop. Because of the fact that one memory circuit is in the hold state in the case of a high clock signal while the other circuit is in the hold state in the case of a low clock signal, a master-slave flipflop circuit which is controlled by only one clock signal can thus be realized. Using a cascade connection of the described flipflop circuits, a shift register which is controlled by only one clock signal can be simply implemented.

What is claimed is:

1. An integrated memory circuit comprising: a clock input for receiving a clock signal, a data input for receiving a data bit under the control of the clock signal, and a data output, the memory circuit also including a memory loop comprising a first and a second gate each having a switching threshold, characterized in that said first and second gates are switched by the clock signal, the switching threshold of the first gate being substantially different from the switching threshold of the second gate, and that the first gate includes a first input coupled to an output of the second gate and a second input coupled to the clock input, an output of the first gate being coupled to a first input of the second gate which includes a second input coupled to the clock input and a third input coupled to the data input.

2. An integrated memory circuit as claimed in claim 1, characterized in that the memory circuit includes complementary MOS transistors, gate electrodes of a first and a second assembly, each comprising a P-channel MOS transistor and an N-channel MOS transistor, constituting the second inputs of the first and the second gates, respectively, the ratio of the conductivity factors of said P-channel and N-channel MOS transistors of the first assembly being substantially different from the ratio of the conductivity factors of the P-channel and N-channel MOS transistors of the second assembly.

3. An integrated memory circuit as claimed in claim 2, characterized in that the first gate includes a NAND-gate, and the second gate includes a gate combination whose output generates a logic inverse of the result of a logic AND-function performed on the signal at its first input and the result of a logic OR-function performed on the signals at its second and third inputs, the switching threshold of said first assembly being substantially lower than the switching threshold of said second assembly.

4. An integrated memory circuit as claimed in claim 3, characterized in that for a supply voltage of 5 volts the switching threshold of said first assembly is between 0.5 and 1.5 volts lower than the switching threshold of said second assembly.

5. An integrated memory circuit as claimed in claim 2, characterized in that the first gate includes a NOR-gate, the second gate includes a gate combination whose output generates the logic inverse of the result of a logic OR-function performed on the signal at its first input and the result of a logic AND-function performed on the signals at its second and third inputs, the switching threshold of said first assembly being substantially higher than the switching threshold of said second assembly.

6. An integrated memory circuit as claimed in claim 5, characterized in that for a supply voltage of 5 volts the switching threshold of said first assembly is between 0.5 and 1.5 volts higher than the switching threshold of said second assembly.

7. An integrated memory circuit as claimed in claim 1 wherein said first gate comprises a NAND-gate and the second gate comprises an OR-gate having first and second inputs that constitute the second and third inputs, respectively, of the second gate, said second gate further comprising a second NAND-gate having a first input coupled to an output of the OR-gate, a second input that constitutes said first input of the second gate, and an output that constitutes said output of the second gate.

8. An integrated memory circuit as claimed in claim 1 wherein said first gate comprises a NOR-gate having first and second inputs that constitute said first and second inputs of the first gate and an output that constitutes the output of the first gate, and the second gate comprises an AND-gate having first and second inputs that constitute the second and third inputs, respectively, of the second gate, said second gate further comprising a second NOR-gate having a first input coupled to an output of the AND-gate, a second input that constitutes said first input of the second gate, and an output that constitutes said output of the second gate.

9. An integrated memory circuit as claimed in claim 1 wherein said first and second gates comprise first and second assemblies, respectively, each assembly including at least first and second complementary MOS transistors comprising a P-channel MOS transistor and an N-channel MOS transistor, the ratio of the conductivity factors of said P-channel and N-channel MOS transistors of the first assembly being substantially different from the ratio of the conductivity factors of the P-channel and N-channel MOS transistors of the second assembly whereby said first and second gates do not respond simultaneously to the clock signal.

10. An integrated master-slave circuit comprising: a first integrated memory circuit comprising: a clock input for receiving a clock signal, a data input for receiving a data bit under the control of the clock signal, and a data output, the memory circuit also including a memory loop comprising a first and second gate each having a switching threshold, charcterized in that said first and second gates are switched by the clock signal, the switching threshold of the first gate being substantially different from the switching threshold of the second gate, wherein the first gate includes a first input coupled to an output of the second gate and a second input coupled to the clock input, an output of the first gate being coupled to a first input of the second gate which includes a second input coupled to the clock input and third input coupled to the data input, wherein the first gate includes a NAND-gate, and the second gate includes a gate combination whose output generates a logic inverse of the result of a logic AND-function performed on the signal at its first input and the result of a logic OR-function performed on the signals at its second and third inputs, and means coupling said first integrated memory circuit in cascade with a second integrated memory circuit, said second integrated memory circuit comprising: a clock input for receiving a clock signal, a data input for receiving a data bit under the control of the clock signal, and a data output, the memory circuit also including a memory loop comprising a first and second gate each having a switching threshold, characterized in that said first and second gates are switched by the clock signal, the switching threshold of the first gate being substantially different from the switching threshold of the second gate, wherein the first gate includes a first input coupled to an output of the second gate and a second input coupled to the clock input, an output of the first gate being coupled to a first input of the second gate which includes a second input coupled to the clock input and a third input coupled to the data input, wherein the first gate includes a NOR-gate, the second gate includes a gate combination whose output generates the logic inverse of the result of a logic OR-function performed on the signal at its first input and the result of a logic AND-function performed on the signals at its second and third inputs, said first and second integrated memory circuits each receiving the same clock signal.

* * * * *